US006576978B2

(12) United States Patent
Trivedi (10) Patent No.: US 6,576,978 B2
(45) Date of Patent: Jun. 10, 2003

(54) USE OF NON-ION-IMPLANTED RESISTIVE SILICON OXYNITRIDE FILMS AS RESISTORS

(75) Inventor: Jigish D. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/896,400

(22) Filed: Jun. 29, 2001

(65) Prior Publication Data

US 2001/0045618 A1 Nov. 29, 2001

Related U.S. Application Data

(62) Division of application No. 09/549,823, filed on Apr. 14, 2000.

(51) Int. Cl.[7] .............................................. H01L 29/00
(52) U.S. Cl. ...................... 257/537; 257/536; 257/760; 257/904; 257/379; 257/381; 438/381; 438/954
(58) Field of Search ................................. 257/536, 537, 257/760, 904, 379, 381; 438/210, 238, 381, 382, 384, 385, 954, 786

(56) References Cited

U.S. PATENT DOCUMENTS

| | | | | |
|---|---|---|---|---|
| 3,979,613 A | * | 9/1976 | Kroger et al. | 257/411 |
| 4,051,273 A | * | 9/1977 | Abbas et al. | 204/192.23 |
| 4,062,040 A | * | 12/1977 | Abbas et al. | 257/394 |
| 4,142,112 A | * | 2/1979 | Kroger | 257/538 |
| 4,289,797 A | * | 9/1981 | Akselrad | 118/50.1 |
| 4,907,064 A | * | 3/1990 | Yamazaki et al. | 257/639 |
| 4,950,620 A | | 8/1990 | Harrington, III | 437/60 |
| 5,200,356 A | | 4/1993 | Tanaka | 437/60 |
| 5,616,951 A | | 4/1997 | Liang | 257/536 |
| 5,930,638 A | | 7/1999 | Reedy et al. | 438/382 |
| 6,046,080 A | * | 4/2000 | Wu | 438/238 |
| 6,124,198 A | | 9/2000 | Moslehi | 438/622 |
| 6,127,238 A | | 10/2000 | Liao et al. | 438/382 |
| 6,209,484 B1 | | 4/2001 | Huang et al. | 118/723 |
| 6,299,294 B1 | * | 10/2001 | Regan | 347/62 |
| 2001/0006842 A1 | | 7/2001 | Hattori | 438/584 |

FOREIGN PATENT DOCUMENTS

| | | | | | |
|---|---|---|---|---|---|
| JP | 61172754 A | * | 8/1986 | | B41J/3/20 |
| JP | 61174590 A | * | 8/1986 | | G02F/1/13 |
| JP | 62201264 A | * | 9/1987 | | B41J/3/20 |
| TW | 430988 A | * | 4/2001 | | H01L/27/11 |

OTHER PUBLICATIONS

Toshiyuki Okumura et al., "A SiOx Resistor Load SRAM Process for ASIC Applications", IEEE, 1998 Custom Integrated Circuits Conference, 1998, pp. 25.6.1–25.6.4.*
Wolf, "Silicon Processing for the VLSI Era, vol. 2" (pp. 274–275).

* cited by examiner

*Primary Examiner*—Eddie Lee
*Assistant Examiner*—José R. Díaz
(74) *Attorney, Agent, or Firm*—Howrey Simon Arnold & White, LLP (57) ABSTRACT

The present disclosure is directed to the use of non-ion-implanted silicon oxynitride films as resistive elements. Such films have been traditionally used in semiconductor processing as antireflective coatings, but their utility as highly resistive circuit elements has heretofore not been realized. Such films find specific utility when used as the load resistors in a 4-T SRAM cell.

13 Claims, 7 Drawing Sheets

USE OF NON-ION-IMPLANTED RESISTIVE SILICON OXYNITRIDE FILMS AS RESISTORS

This application is a divisional of co-pending application Ser. No. 09/549,823, filed Apr. 14, 2000, which is incorporated by reference and to which priority is claimed.

FIELD OF THE INVENTION

This invention relates generally to the field of semiconductor processing and specifically to the use of silicon oxynitride films as resistive elements.

BACKGROUND OF THE INVENTION

Figure 1:
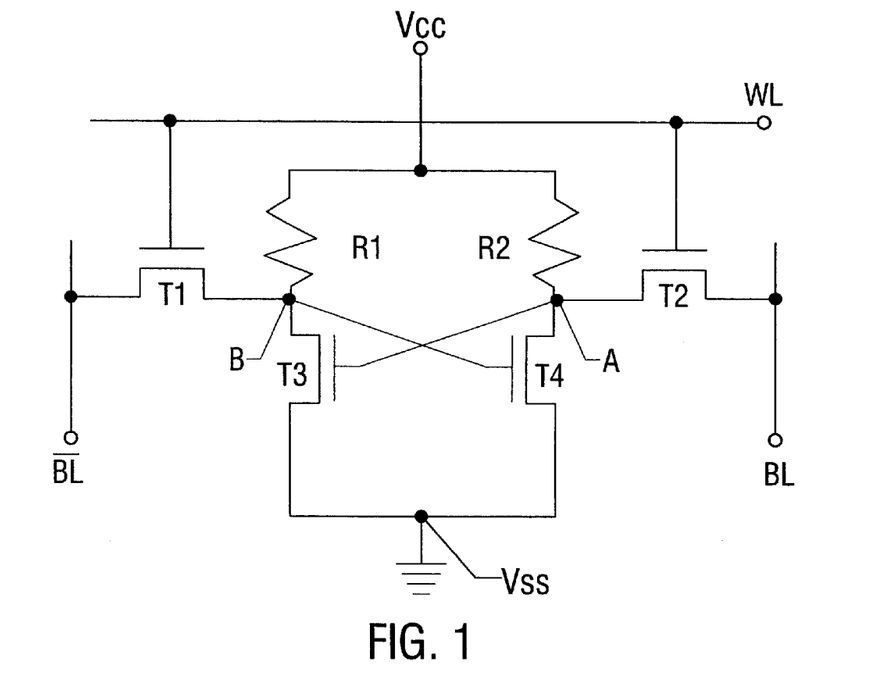
FIG. 1 shows the electrical schematic of a 4-T SRAM cell.

The four transistor (4-T) SRAM cell, shown schematically in FIG. 1, is a well known architecture that is often preferred over its 6-T counterpart due to its small cell size. The 4-T architecture uses two access transistors T1 and T2 and two storage transistors T3 and T4 that are cross-coupled in a traditional flip-flop-type fashion. This architecture also uses two load resistors R1 and R2 to limit the current draw through the cell. These resistors are usually of a very high resistance (on the order of Giga-ohms/square) and optimally limit the current draw through the cell to a value of about 30–35 pA.

The load resistors are typically fabricated in a second layer of polysilicon (poly 2) and this well-known fabrication process is briefly described here. After formation of the gates of the four transistors in poly 1, an interpoly dielectric, usually a silicon dioxide or "oxide" for short, is deposited and two contacts per cell are etched therein. These two contacts correspond to points A and B on the circuit schematic of FIG. 1 and each contact is generally made to expose both a portion of the gate of one of the storage transistors and a portion of the diffusion region (i.e., source or drain) of the other storage transistor and one of the access transistors. For example, the contact at point A exposes the gate of storage transistor T3 and one of the diffusion regions of storage transistor T2 and access transistor T4. Thereafter, the poly 2 is deposited. This poly 2 is usually doped with a suitable n-type dopant (usually phosphorus) in situ during its deposition, although it may also be doped after deposition. Thereafter, a portion of the poly 2 is masked to expose the location of the load resistors. These exposed portions of the poly 2 are then subjected to p-type doping (usually arsenic), and then the poly 2 is patterned and etched. The effect is to make an n-p-n structure in the poly 2, a structure which comprises two back-to-back diodes and thus draws the very low levels of current that are required for suitable operation of the cell. See Wolff & Tauber, Silicon Processing for the VLSI Era, Vol. 2 Process Integration, ch. 8, pg. 582 for more background concerning the processing and architecture of a typical 4-T SRAM cell.

Other attempts have been made to fabricate the load resistors not out of polysilicon, but out of a dielectric material. Thus, in U.S. Pat. No. 5,616,951 to Liang, there is disclosed a vertical resistor 28 inside of the contact 27 in the interpoly oxide 24. The resistor is comprised of an oxide-nitride-oxide stack, an oxide-nitride stack, or a nitride-oxide stack (see FIG. 8). Liang's resistor is in contact with both the poly 1 gates 26 and the poly 2 25 to thus achieve a 4-T SRAM cell of suitable functionality. However, the fabrication process for Liang's resistor is complicated and involves the deposition or growth of numerous layers. In U.S. Pat. No. 4,950,620 to Harrington, there is disclosed a process for making a load resistor out of the gate oxide by ion implanting it with arsenic. Harrington also discloses that silicon oxynitrides ("oxynitrides") or silicon nitrides ("nitrides") may also be used. Unfortunately, Harrington's process requires this extra ion implantation step to render the gate dielectric resistive enough to function properly as a load resistor. U.S. Pat. No. 5,200,356 to Tanaka is similar to Harrington's process in that it involves the ion implantation of silicon or phosphorous into the gate dielectric to manufacture the load resistor. These prior art references are hereby incorporated by reference in their entirety for all that they teach.

It is evident from foregoing descriptions that the prior art takes several processing steps to form the load resistors. Moreover, it has proven difficult to shrink or scale SRAM cells that employ poly 2 load resistors. It would be advantageous to instead use a film in lieu of the poly 2 of suitable resistance such that that film could merely be deposited and patterned without additional processing such as ion implantation, and which could be easily scaled for use in future technologies.

SUMMARY OF THE INVENTION

In view of the foregoing considerations, the present invention is directed to the use of non-ion-implanted resistive silicon oxynitride films as resistive elements. Such films have been traditionally used in semiconductor processing as antireflective coatings, but their utility as highly resistive circuit elements has heretofore not been realized. Such films find specific utility when used as the load resistors in a 4-T SRAM cell.

BRIEF DESCRIPTION OF THE DRAWINGS

The foregoing and other features and aspects of the present invention will be best understood with reference to the following detailed description of a specific embodiment of the invention, when read in conjunction with the accompanying drawings, wherein.

DETAILED DESCRIPTION OF A SPECIFIC EMBODIMENT OF THE INVENTION

In the disclosure that follows, in the interest of clarity, not all features of actual implementations are described. It will of course be appreciated that in the development of any such actual implementation, as in any such project, numerous engineering and design decisions must be made to achieve the developers' specific goals and subgoals (e.g., compliance with system- and business-related constraints), which will vary from one implementation to another. Moreover, attention will necessarily be paid to proper engineering and design practices for the environment in question. It will be appreciated that such a development effort might be complex and time-consuming, but would nevertheless be a routine undertaking for those of ordinary skill in the field of semiconductor processing.

Stated broadly, the present invention is directed to the use of silicon oxynitride ($Si_xO_yN_z$) films as resistive elements. Such films have traditionally been used in the semiconductor industry in a variety of applications. For example, silicon oxynitride films have been deposited on top of metals and used as antireflective coatings to prevent reflections during photolithography that could negatively impact the line width of the metal being patterned. However, in this and other traditional uses of silicon oxynitride films, the potentially resistive nature of these films has not been capitalized upon.

Figure 2A:
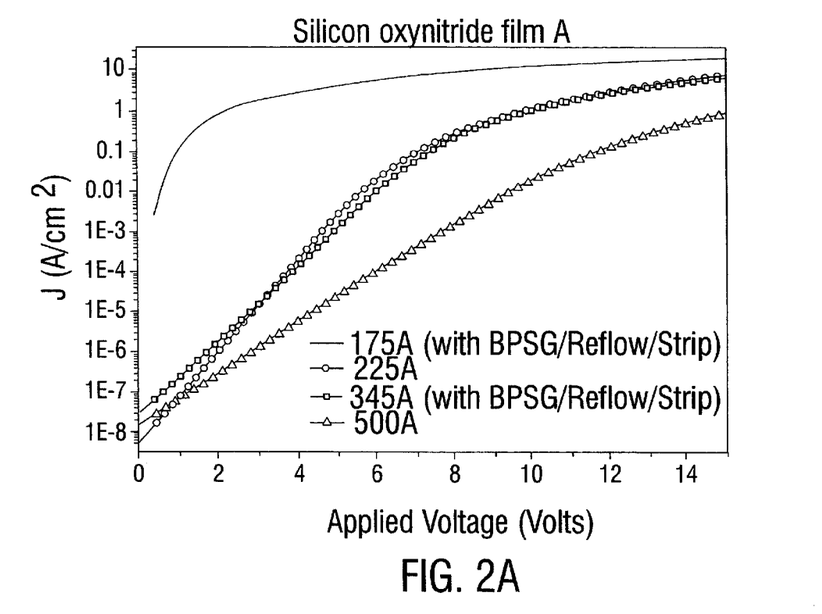
FIG. 2A shows the J-V characteristics of silicon oxynitride film A.
Figure 2B:
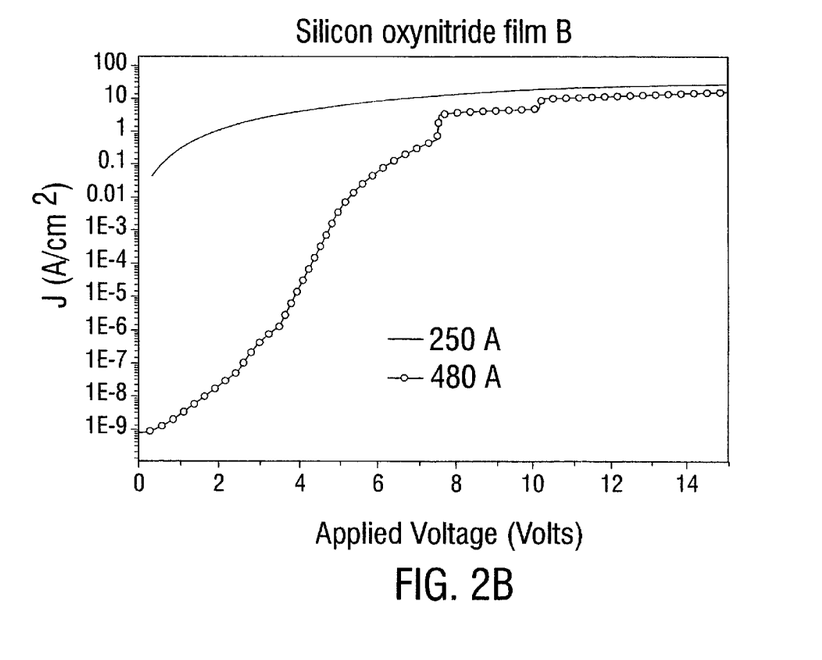
FIG. 2B shows the J-V characteristics of silicon oxynitride film B.
Figure 2C:
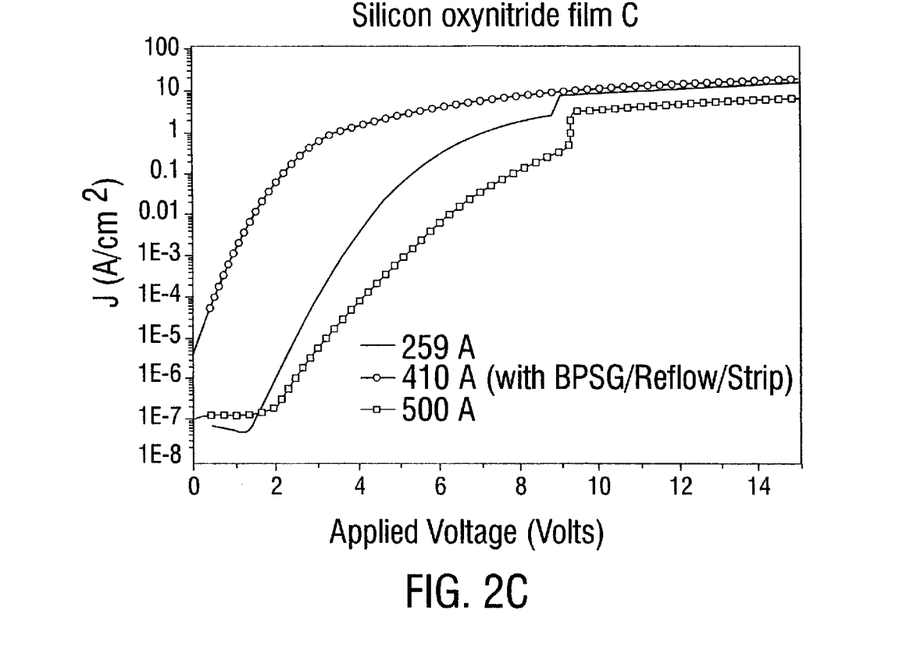
FIG. 2C shows the J-V characteristics of silicon oxynitride film C.
Figure 2D:
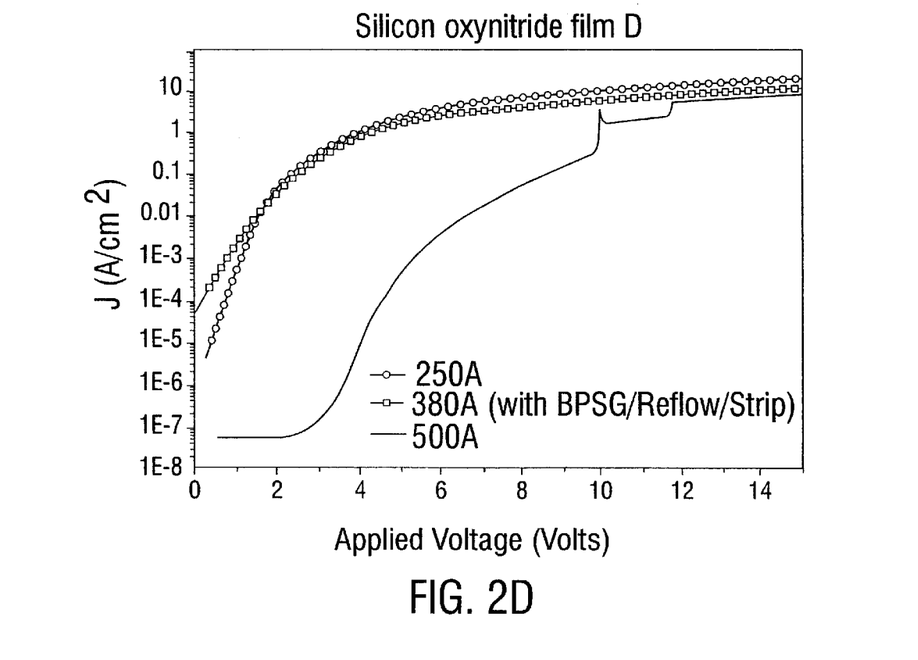
FIG. 2D shows the J-V characteristics of silicon oxynitride film D.
Figure 2E:
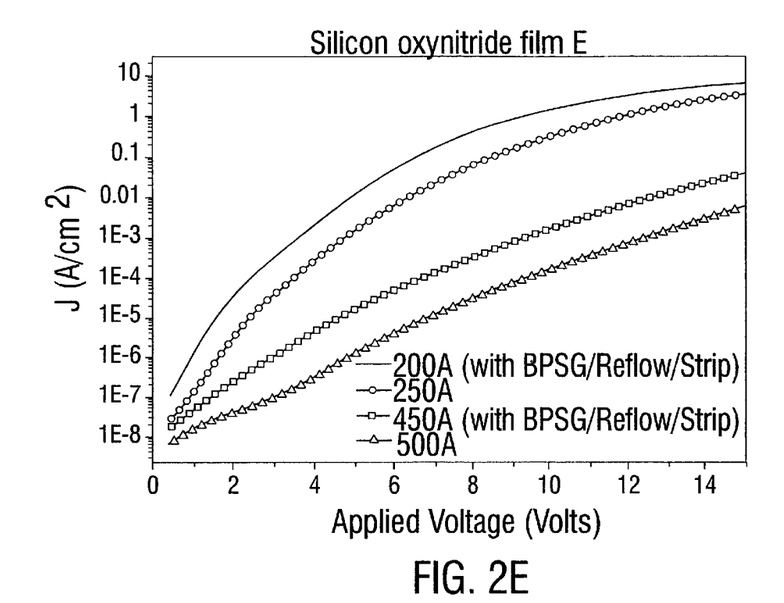
FIG. 2E shows the J-V characteristics of silicon oxynitride film E.
Figure 2F:
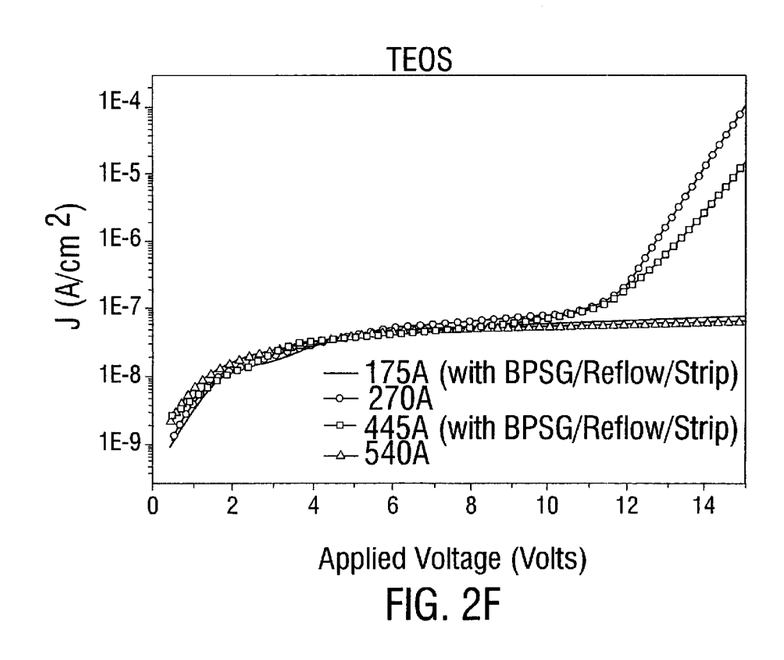
FIG. 2F shows the J-V characteristics of a TEOS oxide film.

While silicon oxynitride films are generally used as dielectrics (i.e., insulators), the silicon oxynitride films disclosed herein are used as resistors because of their propensity to leak significant amounts of current even when subject to even the smallest voltages. FIGS. 2A–2F illustrate this point. FIGS. 2A–2E show the J-V curves for a variety of silicon oxynitride films and thickness. These films are arbitrarily referred to herein as silicon oxynitride film A (FIG. 2A), silicon oxynitride film B (FIG. 2B), silicon oxynitride film C (FIG. 2C), silicon oxynitride film D (FIG. 2D), and silicon oxynitride film E (FIG. 2E). "J" refers to current density, which is measured in $A/cm^2$. "V" refers to the voltage applied across the film of interest. As FIGS. 2A–2E show, all of the silicon oxynitride films show significant leakage (e.g., $J=10^{-4}$ $A/cm^2$) with as little as a few volts applied across the capacitor. By contrast, and referring to FIG. 2F, a standard low pressure CVD TEOS oxide (a non-silicon oxynitride film) shows no appreciable leakage (e.g., $J=10^{-7}$ $A/cm^2$) in this voltage range. Of course, and as one of skill will realize, at higher voltages (e.g., 12 Volts), even the TEOS can be made to conduct due to tunneling effects. However, the resistive nature of the silicon oxynitride films disclosed herein should be distinguished from other well-known conduction mechanisms in dielectrics, such as tunneling and Frankel-Poole conduction. Conduction resulting from these conduction mechanisms is not exemplary of a "resistive" oxynitride film as that term is used herein. Instead those mechanisms are indicative of the use of an oxynitride film used in a dielectric capacity, which can be made to conduct only upon the application of high voltages (i.e., electric fields). By contrast, a "resistive" silicon oxynitride film will conduct or leak appreciably upon the application of even the smallest voltages. However, a resistive silicon oxynitride film need not have a strictly linear relationship between applied voltage and current density to be considered "resistive."

The resistivity of the silicon oxynitride film is governed in large part by the content of silicon in the film. The higher the silicon content, the lower the resistivity of the film. The silicon content can be varied by at least the following two ways. First, the application of heat can increase the silicon content of the film and thus lower the resistivity of the silicon oxynitride film. Heat following film deposition changes the resistivity of the film as it goes through morphological changes. This change in grain structure may explain the decrease in resistivity, just as a polysilicon film's resistivity is decreased with heat treatment. Furthermore, the heat at which the silicon oxynitride film is deposited may change the amount of silicon in the film. Second, by adjusting the gas flow rates during the deposition of the silicon oxynitride film, the silicon content can likewise be modified. While the specific process for fabricating a resistive silicon oxynitride film will be discussed later in more detail, the deposition of each of these films involves the use of silane ($SiH_4$) and nitrous oxide ($N_2O$) as reactant gases in a plasma enhanced chemical vapor deposition (PECVD). By increasing the relative flow of the silane during deposition, the resulting silicon oxynitride film can be made richer in silicon. By using the silicon oxynitride processes disclosed herein, a resistive silicon oxynitride film can be created with the following characteristics; $Si_xN_yO_z$, where $x=0.39$–$0.65$, $y=0.02$–$0.56$, and $z=0.05$–$0.33$. By adjusting the silicon content of the silicon oxynitride film between 39 and 65 percent in these ways, the resistance of the resulting film may be tailored to the appropriate value. Specifically, the sheet resistance of the silicon oxynitride film may be made to vary from approximately 100 ohms/square (for a film with a very high silicon content, i.e. 65%) to $10^{12}$ ohms/square (for a film with a very low silicon content, i.e., 39%). Moreover, a silicon oxynitride film can alternatively be doped to change its resistance, for example, by ion implantation with boron or phosphorous at doses of $10^{12}$ atoms/$cm^2$ to $5 \times 10^{15}$ atoms/$cm^2$.

Figure 3:
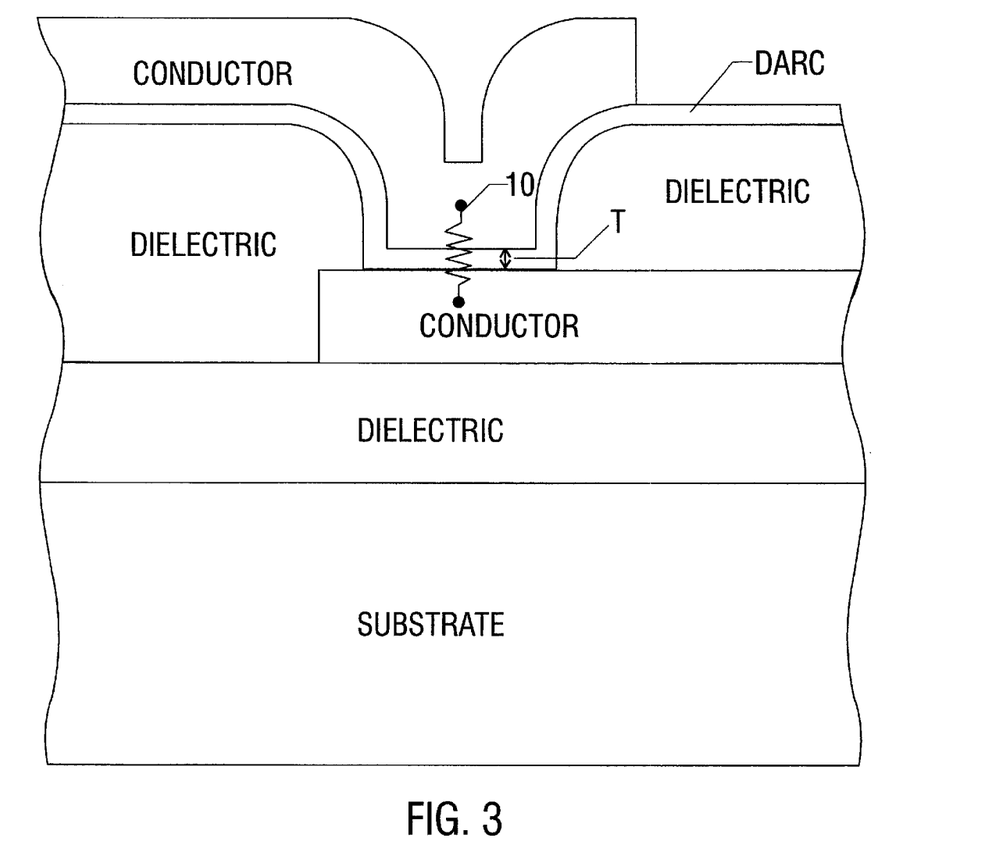
FIG. 3 shows a cross-section of a vertical silicon oxynitride resistor.

Thus, the resistivity of a given silicon oxynitride film varies over a large range, and that range can be varied by modifying the process as suggested above. This provides the process engineer desirous of using a silicon oxynitride resistor in a process with a great deal of flexibility in optimizing a given silicon oxynitride film for a given application. As an example, suppose it is desired to use a silicon oxynitride film to make a vertical 1 Mega-ohm resistor 10, as shown in cross-section in FIG. 3. The conductive bodies or layers in FIG. 3 could be any conductive material suitable for use in semiconductor processing, including but not limited to doped or undoped polysilicon, doped or undoped crystalline silicon (such as a diffusion region formed in a silicon substrate), aluminum, tungsten or titanium. From the J-V curves provided for the various silicon oxynitride films disclosed, it is decided to use a 410 Angstrom thick silicon oxynitride film C. According to the J-V curves for this film (see FIG. 2C), this film draws a current density of approximately 0.1 $A/cm^2$ at 5 volts. According to Ohm's law, the resistor must draw 5 V divided by $10^6$ ohms or 5 $\mu A$ of current. Because the current density of the 410 Angstrom thick silicon oxynitride film C is 0.1 $A/cm^2$ at 5 V, the area of the resistor needs to be 5 $\mu A$ divided by 0.1 $A/cm^2$ or $5 \times 10^5$ $cm^2$, or 5000 square microns. If it turns out that the resulting resistor value is too high, this can be remedied in any number of ways until the proper value is reached for the task at hand. For example, to lower the resistance of the resistor, the thickness of the silicon oxynitride film C could be minimized, the flow of silane gas during deposition could be increased to increase the silicon content of the film, the silicon oxynitride film C could be subject to higher post-processing temperatures to increase the silicon content of the film, the area of the resistor could be increased, or a different silicon oxynitride film with lower resistivity (i.e., higher leakage) could be used. Such is process optimization is common in semiconductor fabrication and easily accomplished by one skilled in the art without the need for undue experimentation.

Figure 4:
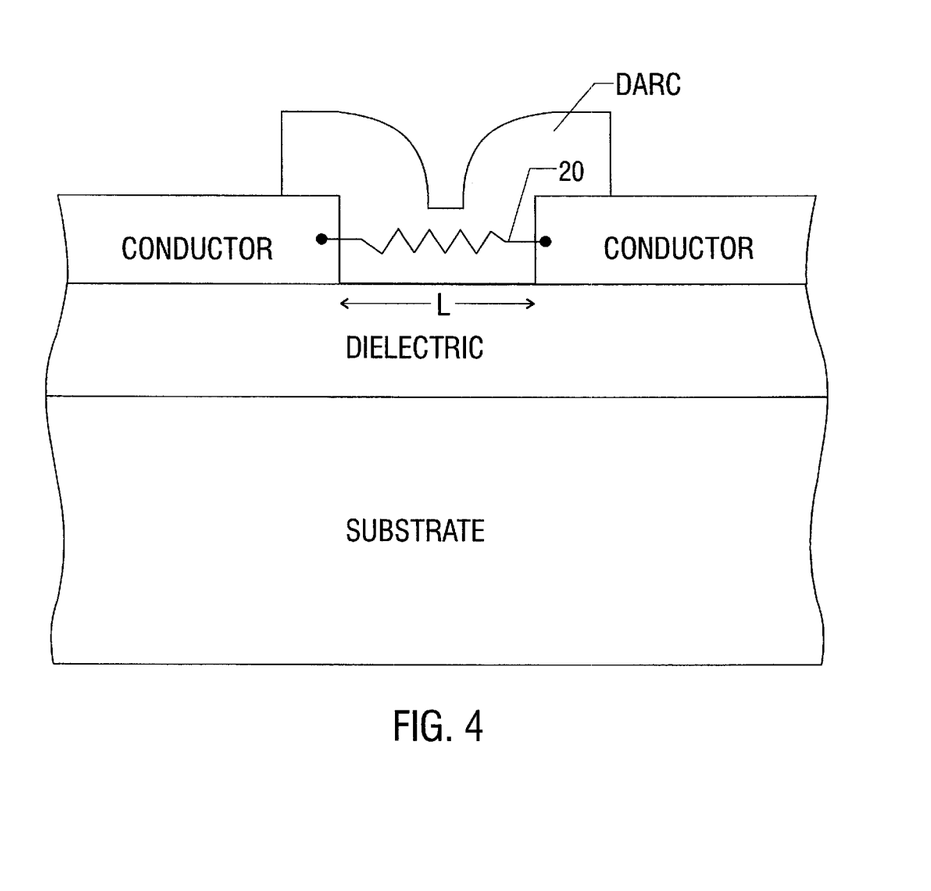
FIG. 4 shows a cross-section of a horizontal silicon oxynitride resistor.

Similarly, a horizontal resistor 20, such as that disclosed in FIG. 4, can also be fabricated using a silicon oxynitride film. Because the length L of the conduction path through a horizontal silicon oxynitride resistor will generally be much greater than the length of the conduction path through a vertical silicon oxynitride resistor (such length being the thickness T of the silicon oxynitride layer in FIG. 3), the J-V curves of FIGS. 2A–2E may be of less value in process optimization. This is because FIGS. 2A–2E show the conduction properties of relatively thin silicon oxynitride films (i.e., less than 500 Angstroms) and not the conduction properties of the silicon oxynitride films at bulk values (i.e., on the order of microns). One desirous of manufacturing a horizontal resistor (or other resistor in which the conduction path through the silicon oxynitride layer is significant) may wish to experiment by building horizontal resistor test devices and generating curves similar to FIGS. 2A–2E to gain a better understanding of the bulk resistance of the silicon oxynitride layers. Then, using such experimental curves, the processing engineer will know to modify the process or geometry of the test resistors to fabricate a suitable resistor for a given application. Again, such process optimization is common in semiconductor fabrication and easily accomplished by one skilled in the art without the need for undue experimentation.

Through a similar process of optimization, suitable load resistors for a 4-T SRAM cell can be fabricated using a silicon oxynitride layer. To modify the traditional poly 2 load resistor process described earlier, a silicon oxynitride film is deposited in lieu of the poly 2 layer, and then, in a first embodiment, the silicon oxynitride layer is patterned and etched just as the poly 2 would have been in the prior art. Many standard plasma etches exist in the industry that are capable of etching the silicon oxynitride layer. Otherwise, and in contradistinction to the prior art discussed earlier, no extra, doping, masking, or implantation steps are required to optimize the silicon oxynitride film. Of course, some amount of optimization will be needed to achieve a process that will draw an optimal 30–35 pA of load current through the silicon oxynitride load resistors, as outlined above. Moreover, the use of a silicon oxynitride film should be more easily scalable to smaller geometries than the traditional poly 2 load resistors.

Figure 5:
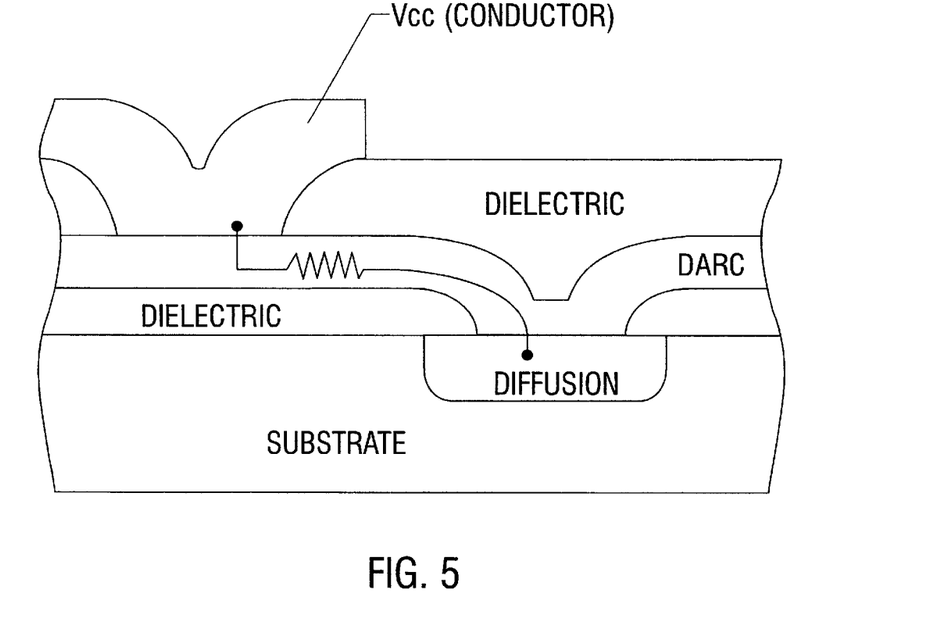
FIG. 5 shows a cross-section of a horizontal silicon oxynitride resistor suitable for use in a 4-T SRAM process. 7

As one skilled in the art will recognize, and referring to FIG. 5, the silicon oxynitride layer can be tied to a conductive power bus (i.e., Vcc) through a contact in the dielectric that overlies the silicon oxynitride layer, just as the poly 2 is tied to a conductive power bus in traditional SRAM architectures. This power bus usually runs parallel to and is formed of the same material as the conductive bit lines, and makes periodic contact to the silicon oxynitride layer. Of course, in this embodiment, due to the horizontal nature of the silicon oxynitride resistor, the value of a given bit's load resistor will vary with respect to its horizontal distance of the diffusion region from the Vcc contact.

Figure 6:
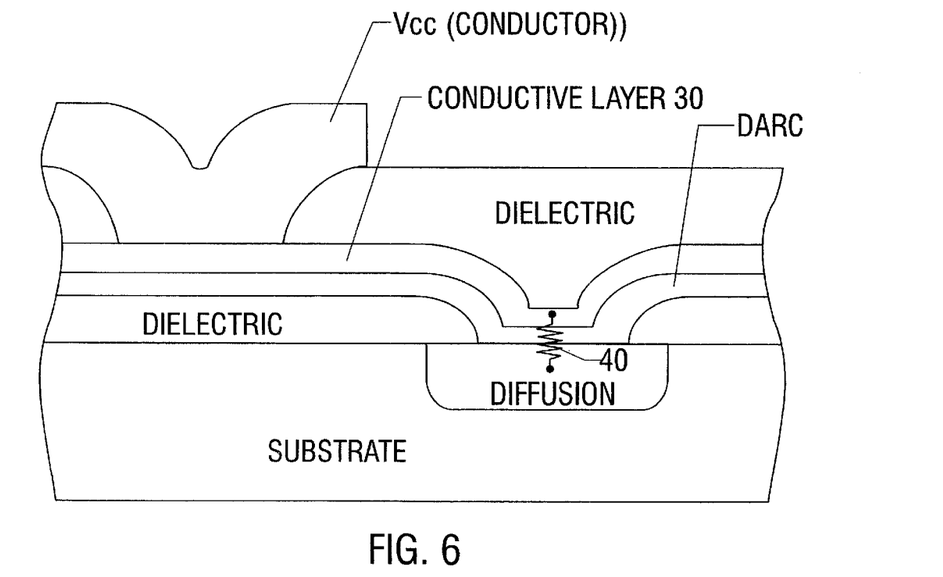
FIG. 6 shows a cross-section of a vertical silicon oxynitride resistor suitable for use in a 4-T SRAM process.

To reduce this effect, and to make the load resistor values more uniform, an additional conductive layer 30 can be deposited on top of and patterned with the silicon oxynitride film, as shown in FIG. 6. Using this alternative embodiment, Vcc can be made to flow right to the top of the diffusion contact, and the load resistor 40 thus becomes the silicon oxynitride layer that appears within the contact. In this alternative embodiment, the load resistor becomes a vertical silicon oxynitride resistor like the resistor disclosed in FIG. 3. One skilled in the art will appreciate that in this alternative embodiment, the load resistor will vary with respect to the vertical distance (i.e., thickness) of the silicon oxynitride layer and with the area of the diffusion contact. Many different conductive materials could be used for conductive layer 30, including doped polysilicon, aluminum, tungsten, titanium, or titanium nitride. Note that if a conductive layer 30 is used to distribute Vcc directly to the silicon oxynitride load resistor within the gate contact 30 in accordance with this alternative embodiment, it is likely that neither the conductive layer 30 nor the underlying silicon oxynitride layer need to be patterned as the poly 2 would be in accordance with the architecture of the prior art. Instead, the conductive layer 30 and the underlying silicon oxynitride layer could be patterned as a simple strip. This alternative embodiment therefore has the extra advantage of being simpler to pattern and etch.

The following process flow can be used to fabricate resistive silicon oxynitride films. One of skill in the art having possession of this disclosure will realize that the thickness and silicon content (and hence resistivity) of the silicon oxynitride film can be varied by varying the deposition time and gas flows accordingly during the deposition step. Preferably, this entire process takes place at 400C, at susceptor spacings of 500 mils, with no purging or endpoint selection:

| step | time (seconds) | pressure (Torr) | RF power (Watts) | gas flows (sccm) |
|---|---|---|---|---|
| stabilze | 20 | servo to 5.6 | 0 | $SiH_4$ = 82<br>$N_2O$ = 80<br>He = 2200 |
| deposition | 3 to 30 | servo to 5.6 | 105 | $SiH_4$ = 40 to 300<br>$N_2O$ = 60–600<br>He = 2200 |
| purge | 5 | open throttle | 0 | He = 2200 |
| pump | 10 | open throttle | 0 | $SiH_4$ = −2 |
| stabilize | 15 | servo to 5.0 | 0 | $O_2$ = 1000<br>He = 400 |
| treat | 30 | servo to 5.0 | 800 | $O_2$ = 1000<br>He = 400 |
| purge | 5 | open throttle | 0 | He = 400 |
| pump | 10 | open throttle | 0 | $O_2$ = −1 |

From the foregoing detailed description of a specific embodiment of the invention, it should be apparent that a way of making resistive silicon oxynitride films and a way of using those films to form resistive elements has been disclosed. Although specific embodiments of the invention have been disclosed herein in some detail, this has been done solely for the purposes of illustrating various aspects and features of the invention, and is not intended to be limiting with respect to the scope of the invention. It is contemplated that various substitutions, alterations, and/or modifications, including but not limited to those design alternatives which might have been specifically noted in this disclosure, may be made to the disclosed embodiment without departing from the spirit and scope of the invention as defined in the appended claims.

What is claimed is:

1. A resistor, comprising:
   a first conductive layer;
   a non-ion-implanted, conductive silicon oxynitride layer placed on the first conductive layer, wherein the silicon oxynitride is represented as $Si_XN_YO_Z$, wherein X is between 0.39 and 0.65, and wherein the silicon oxynitride layer is less than 500 Angstroms thick; and
   a second conductive layer placed on the silicon oxynitride layer.

2. The resistor of claim 1 wherein the silicon oxynitride film is fabricated using plasma enhanced chemical vapor deposition.

3. The resistor of claim 2 wherein the plasma enhanced chemical vapor deposition involves the reaction of silane and nitrous oxide in a reaction chamber.

4. The resistor of claim 3 wherein silane is introduced into the reaction chamber at a gas flow in the range of 40 to 300 sccm and wherein nitrous oxide is introduced into the reaction chamber at a gas flow in the range of 60 to 600 sccm.

5. The resistor of claim 3 wherein a power is applied to the reaction chamber of 105 Watts.

6. The resistor of claim 3 wherein helium is also introduced into the reaction chamber.

7. The resistor of claim 1 wherein the first and second conductive layers include polysilicon, aluminum, tungsten, titanium, or titanium nitride.

8. A 4-T SRAM cell, the SRAM cell comprising two access transistors, two storage transistors and two vertical load resistors, wherein the improvement comprises load resistors formed of a non-ion-implanted, conductive silicon oxynitride layer, wherein the silicon oxynitride is represented as $Si_XN_YO_Z$, wherein X is between 0.39 and 0.65, and wherein the silicon oxynitride layer is less than 500 Angstroms thick.

9. The 4-T SRAM cell of claim 8 wherein the non-ion-implanted resistive silicon oxynitride layer is fabricated using plasma enhanced chemical vapor deposition.

10. The 4-T SRAM cell of claim 9 wherein the plasma enhanced chemical vapor deposition involves the reaction of silane and nitrous oxide in a reaction chamber.

11. The 4-T SRAM cell of claim 10 wherein silane is introduced into the reaction chamber at a gas flow in the range of 40 to 300 sccm and wherein nitrous oxide is introduced into the reaction chamber at a gas flow in the range of 60 to 600 sccm.

12. The 4-T SRAM cell of claim 10 wherein a power is applied to the reaction chamber of 105 Watts.

13. The 4-T SRAM cell of claim 10 wherein helium is also introduced into the reaction chamber.

* * * * *